(12) United States Patent
Ragan et al.

(10) Patent No.: US 6,392,489 B1
(45) Date of Patent: May 21, 2002

(54) PRECISE INTEGRATED CURRENT MIRRORS

(75) Inventors: Lawrence Henry Ragan, Richardson, TX (US); Mark Richard Gehring, Portland, OR (US)

(73) Assignee: RadioCom Corporation, Portland, OR (US)

(*) Notice: Subject to any disclaimer, the term of this patent is extended or adjusted under 35 U.S.C. 154(b) by 0 days.

(21) Appl. No.: 09/527,181

(22) Filed: Mar. 17, 2000

(51) Int. Cl.$^7$ .................................................. H03F 3/45

(52) U.S. Cl. ...................................... 330/288; 330/257

(58) Field of Search ............................... 323/315, 316; 330/257, 288

(56) References Cited

U.S. PATENT DOCUMENTS 6,072,359 A * 6/2000 Branbilla et al. ....... 330/288 X

* cited by examiner

Primary Examiner—Steven J. Mottola
(74) Attorney, Agent, or Firm—Suiter & Associates PC

(57) ABSTRACT

A high precision current control circuit (current mirror) is disclosed. As in prior current mirrors, a reference voltage is generated from the input reference current. An operational amplifier is placed between the reference diode and the bases of the controlled transistors to provide precise reproduction of the reference voltage with ample current to drive many controlled current sources or current sources with high multiplication ratios from the reference current. As compared to prior emitter follower drivers, a lower voltage threshold of operation from an external proportional control results. Lower power supply voltage is supported, since one diode drop is removed from the reference current path.

7 Claims, 7 Drawing Sheets

PRECISE INTEGRATED CURRENT MIRRORS

CROSS-REFERENCE TO RELATED APPLICATIONS (Not Applicable)

STATEMENT REGARDING FEDERALLY SPONSORED RESEARCH OR DEVELOPMENT

This invention did not result in any way from finding or sponsorship of any governmental entity, including the Federal Government of the United States of America.

BACKGROUND OF THE INVENTION

This invention relates to integrated circuit current mirror, and more specifically to such current mirrors requiring large but accurate multiplication ratios or low power supply voltage.

Current mirrors are used to establish the desired bias currents in transistors in integrated circuits. Typically an accurate bias current is developed in a single multiple transistor circuit. The design of these circuits to provide temperature compensated sources is not a subject of this patent, and can be found, for example, in textbooks such as Gray and Meyer ("Analysis and Design of Analog Integrated Circuits"—Paul Gray and Robert G. Meyer. Third Edition published by John Wiley and Sons 1997.) A reference current from such circuits is used, along with current mirrors, to establish the proper bias currents for many circuits. Current mirrors are used in both bipolar and MOS integrated circuits for biasing. The present invention improves the accuracy and reduces the operating voltage required for current mirrors.

BRIEF SUMMARY OF THE INVENTION

This invention incorporates an elementary operational amplifier (opamp) as an integral part of various current mirrors. Use of an opamp provides accurate reproduction of the "rail" (the node to which all the bases or gates in the mirror circuit are connected) voltage of the current mirror, and obviates the usual "helper" transistor, thus reducing the voltage required for the current mirror to function properly. While the opamp requires more transistors than the simple "helper" transistor, there are many applications where the lower operating voltage or better precision justify the additional silicon area required.

BRIEF DESCRIPTION OF THE DRAWINGS

In FIG. 1a), the simplest mirror is shown. Reference current is injected into the base of transistor 1), since the base and collector are connected together. The voltage generated across the base-emitter junction of transistor 1) serves as the reference voltage for the rest of the transistors in the mirror system. Transistors 2), 3), and 4) are driven to nominally the same base emitter voltage, so the same current density will flow in all of them as flows in transistor 1). The dashed line connecting the bases of transistors 3) and 4) is meant to imply that there can be more instances of transistors whose current is controlled by the system. If transistors 2) through 4) are all the same size (emitter area) transistors as transistor 1) they will draw nominally the same current. If their base emitter junctions are scaled with respect to transistor 1), they will draw current in proportion to the scaling factor. For example, if transistor 2) is twice as large as transistor 1), the current in the collector of transistor 2) will be nominally twice that of the current injected into transistor 1) from the reference source (not shown).

There are several error sources in the circuit as shown. There can be errors in scaling and matching of the transistors 1) through 4). These can be reduced by adding degeneration resistors in series with the emitters of all the transistors, also scaled so that the degeneration voltages are the same. Another source of error is the base current required by all the controlled transistors on the rail. The reference current is reduced by the base currents supplied to the controlled transistors. If the total controlled current is substantially higher than the reference current, or the current gain (beta) of the transistors is poor, this causes the actual currents in the controlled transistors to be lower than calculated from the ratio of transistor emitter areas. More significantly, it causes the current to depend on the forward common emitter dc gain (beta) of the devices, so that from one manufacture of integrated circuits to the next there may be unacceptable variation in the controlled bias current.

Figure 1:
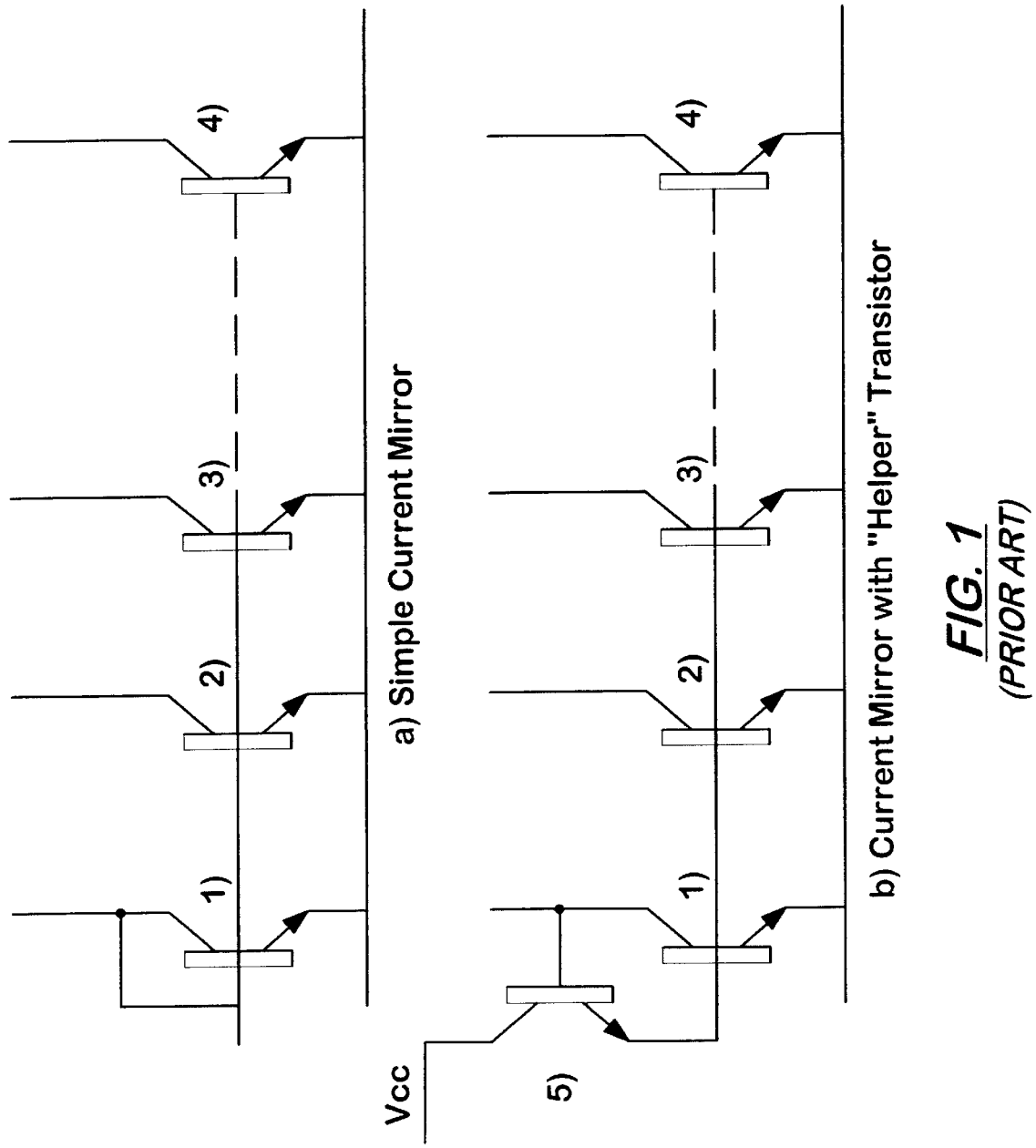
FIG. 1 shows traditional current mirrors.

A common solution to this problem is shown in FIG. 1b). Here an emitter follower stage is added to the reference current path to provide the additional base currents required. Transistors 5) and 1) form a feedback loop which may need to be stabilized with the addition of various components, most typically a capacitor from the reference current input injection node (collector of transistor 1)) to ground. The addition of transistor 5) to the circuit also increases the voltage needed at the reference current input node by one diode drop, typically 0.7 to 0.8 volt. Since the circuitry which generates and distributes the reference current typically has one or more junction drops from the positive power supply (Vcc in FIG. 1b)), this can present a significant impediment to implementation for low power supply voltages. Furthermore, some applications may provide the reference current from an off chip voltage and series resistor, as when the current needs to be adjusted by external circuitry. In this instance the threshold voltage that must be reached before significant current begins to flow in the controlled transistors is increased from one diode drop to two, leaving a compressed voltage control range before the upper limit of the positive power supply is reached.

Figure 2:
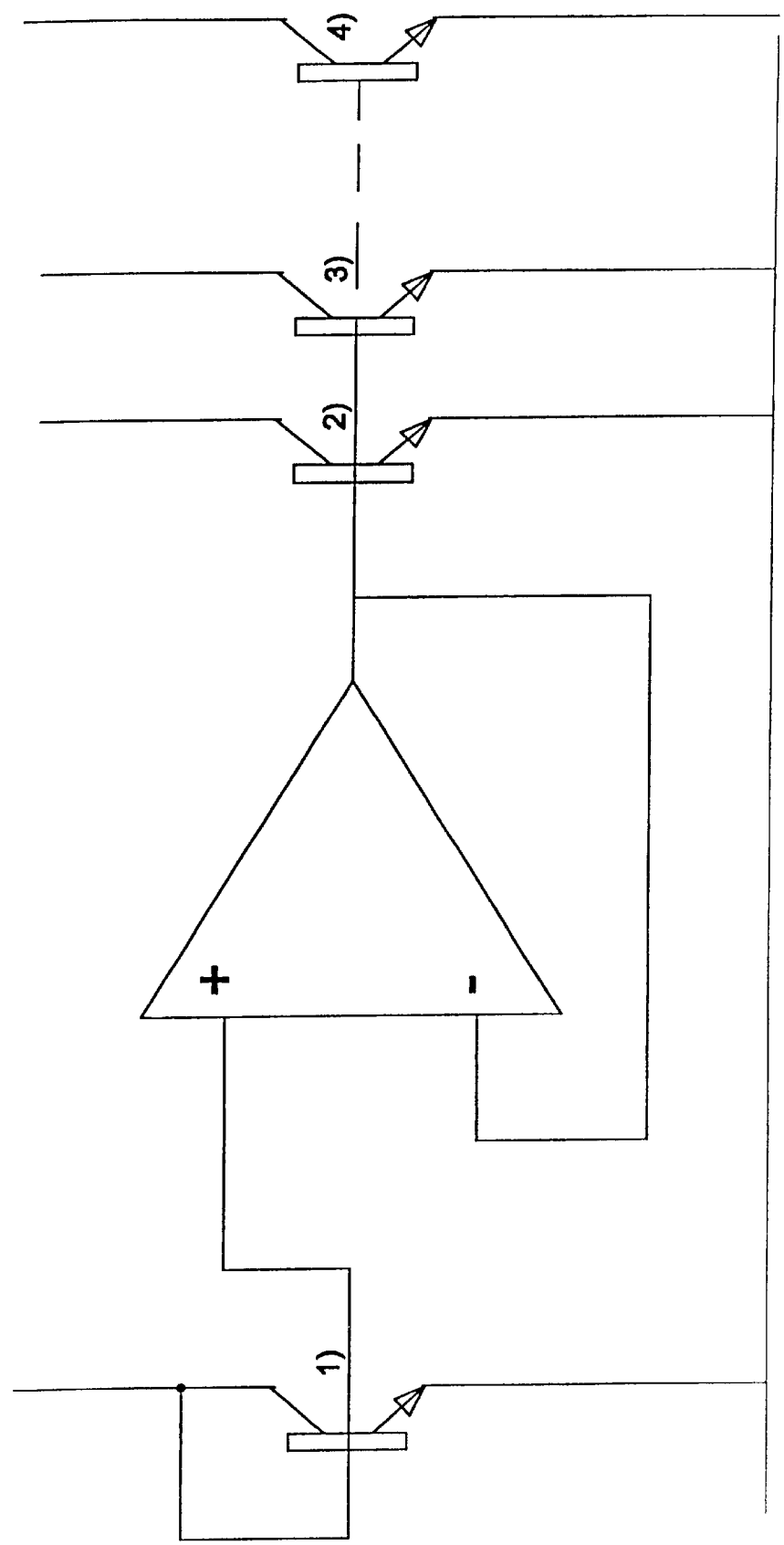

The basic form of the present invention is illustrated in FIG. 2. A dual input, single output amplifier is interposed between the reference diode formed by transistor 1) and the bases of the controlled transistors 2), 3), and 4). Reference current is again received into the base of transistor 1) from a reference current source. The dashed line again indicates there could be any number of controlled transistors. The output of the amplifier is fed back to its negative input. Hence, if the amplifier is balanced, the circuit will reproduce the reference voltage from the base and collector of transistor 1 at the amplifier output, driving the controlled transistors. As in the prior art current mirrors, emitter degeneration can be employed in series with the emitters of the transistors to improve the accuracy of the controlled current with respect to the reference current. Resistors could be employed in the feedback path to provide a lower feedback ratio than one. Resistors from either input to ground or power supply could be used to compensate for imbalance in the amplifier. A similar circuit can be employed for a PNP current mirror using the power supply rail (not shown in FIGS. 1 or 2) as a common node, analogous to the NPN mirrors shown. Specific examples of various circuits, including PNP current mirrors, using the current invention, will now be described in detail.

Figure 3:
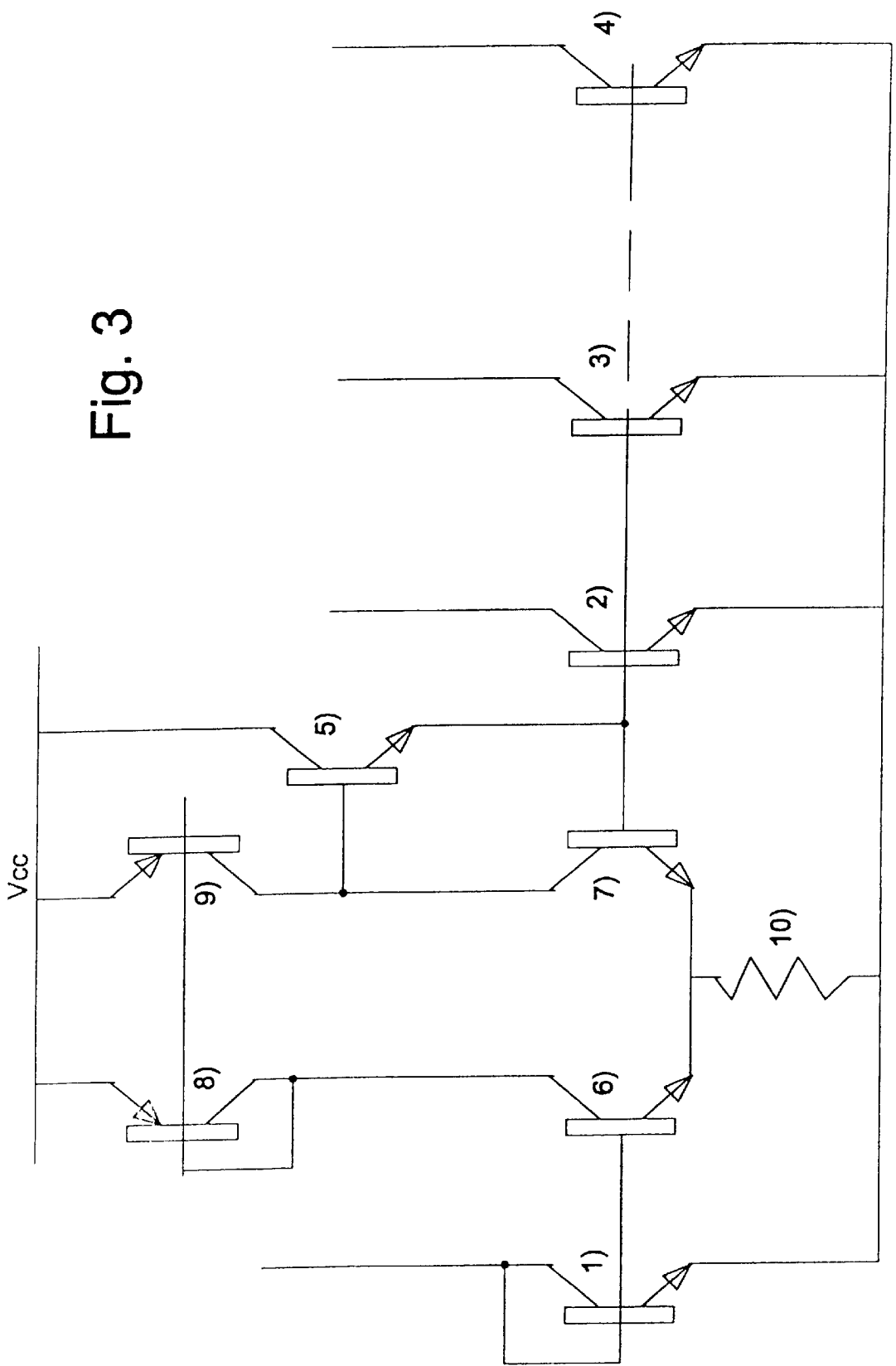

A simple form of the present invention is illustrated in FIG. 3. The base emitter junction of transistor 1) again serves as the reference diode to establish a voltage from the reference current. Helper transistor 5) again provides the extra current required to drive the bases of the controlled transistors 2) through 4). A simple amplifier comprised of transistors 6), 7), 8), and 9) is interposed between the reference voltage and the controlled rail. If one considers transistors 5),6),7),8), and 9) taken together, they comprise a simple opamp. This system may also require an additional component to stabilize the feedback loop of the opamp, typically provided by a capacitor from the base of transistor 5) to ground. To further improve the precision of the circuit, one could provide an unused load on the collector of transistor 8) by placing an additional NPN transistor of the same emitter area and shape as transistor 5 on the other side of the amplifier, with its base connected to the junction of the collectors of transistors 6) and 8), its collector connected to Vcc, and its emitter tied to ground. With reasonably high gain transistors the imbalance introduced by the base current of transistor 5) loading the collector of transistor 9) is insignificant.

The gain of the amplifier will be affected by the choice of amplifier bias current, which can be controlled by the choice of resistor 10). Higher values of the resistor reduce the bias current in the amplifier, and hence the gain. The diversion of reference current into the base of transistor 6) is similarly reduced. The choice of amplifier current, and hence of the value of resistor 10), will depend on the relative importance of current consumed, speed of response, amplifier stability, and overall controlled current accuracy requirements. Resistor 10) provides flexibility in the design to set the gain of the amplifier. In the simplest case, where the resistance is nominally zero (resistor 10 is omitted and the emitters of transistors 6) and 7) are connected to the ground bus) the current density in transistors 6) and 7) is nominally the same as that in reference transistor 1). Minimal loading of reference transistor 1) is provided by choosing transistors 6) and 7) small. This consideration is balanced by the need to maintain perfect balance between transistors 6) and 7) to optimize the accuracy of the rail voltage, which is matched by the circuit to the reference voltage generated by transistor 1).

Figure 4:
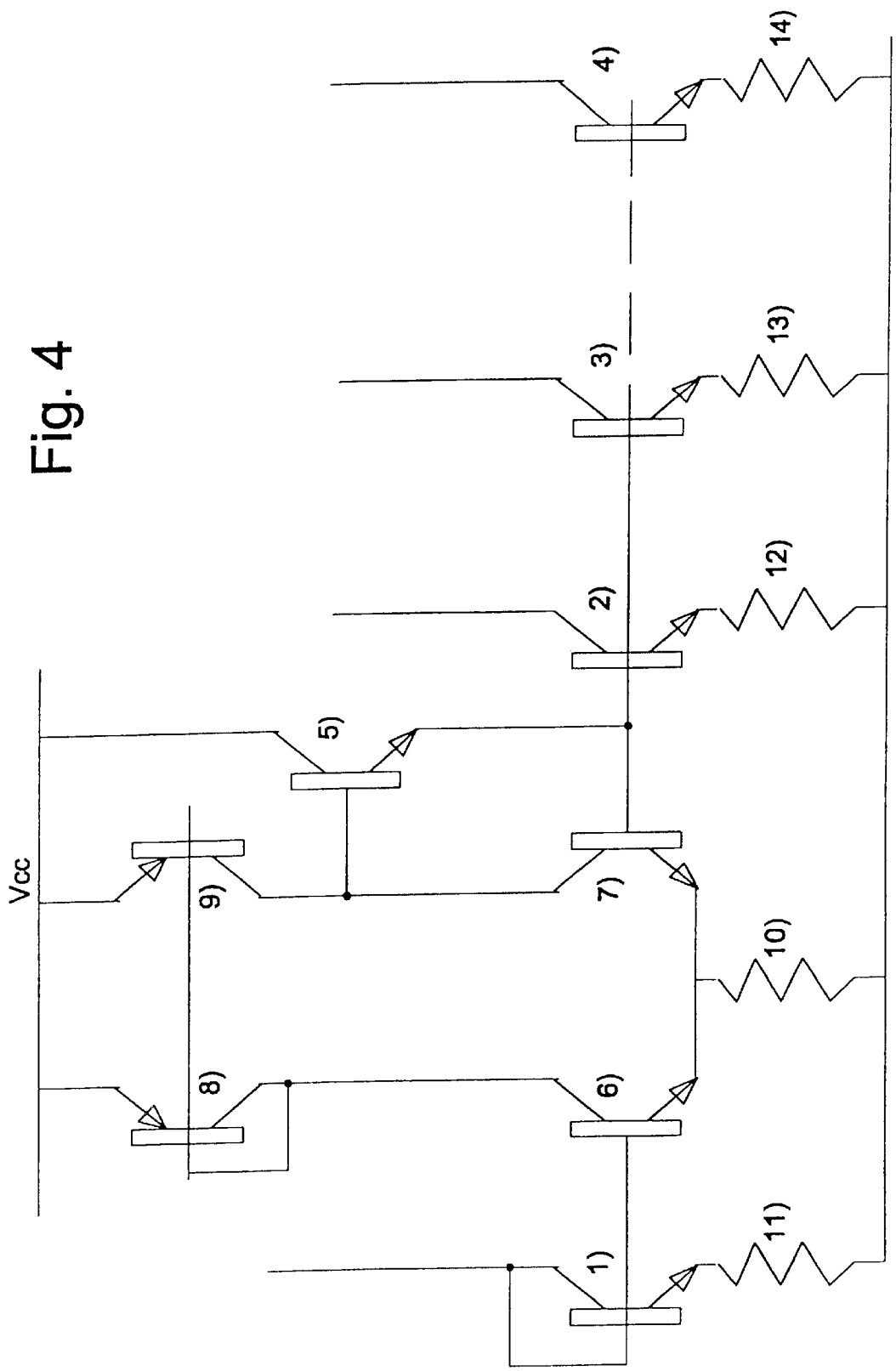

The improved current mirror, like the classic current mirror, can utilize degeneration resistors as shown in FIG. 4 to improve accuracy of the controlled currents. Resistors 11), 12), 13, and 14) are chosen to generate the same voltage above ground. It is not necessary for the voltage across resistor 10) to be the same as that across resistors 11), 12), 13) and 14). Resistor 10) is chosen to set the gain of the amplifier as described in the discussion of the circuit of FIG. 3.

Figure 5:
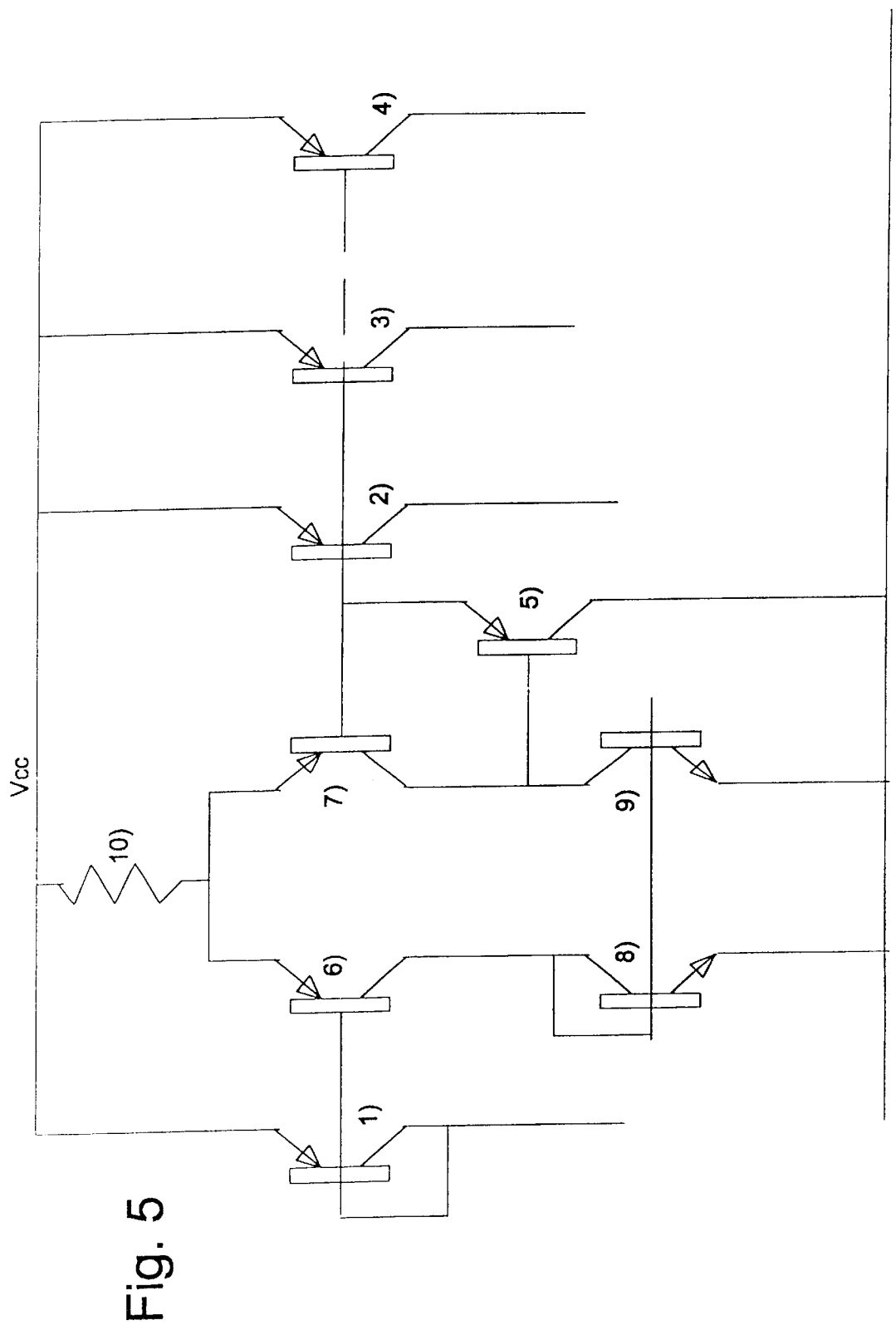

A complementary implementation of the improved current mirror, utilizing PNP reference and controlled transistors, is shown in FIG. 5. The circuit of FIG. 5 operates like the circuit of FIG. 3 except all the currents are reversed, complementary transistors are used, and the reference voltage is developed with respect to Vcc instead of ground. Degeneration resistors could be added to the circuit of FIG. 5 between Vcc and the emitters of transistors 1), 2), 3), 4), analogous to the resistors in FIG. 4. The same tradeoffs in choosing the resistor values accrue to the complementary circuit of FIG. 5 as discussed above for the circuit in FIG. 4. As in the NPN current mirror, resistor 10) could have value of zero, effectively connecting the emitters of transistors 6) and 7) to Vcc.

Figure 6:
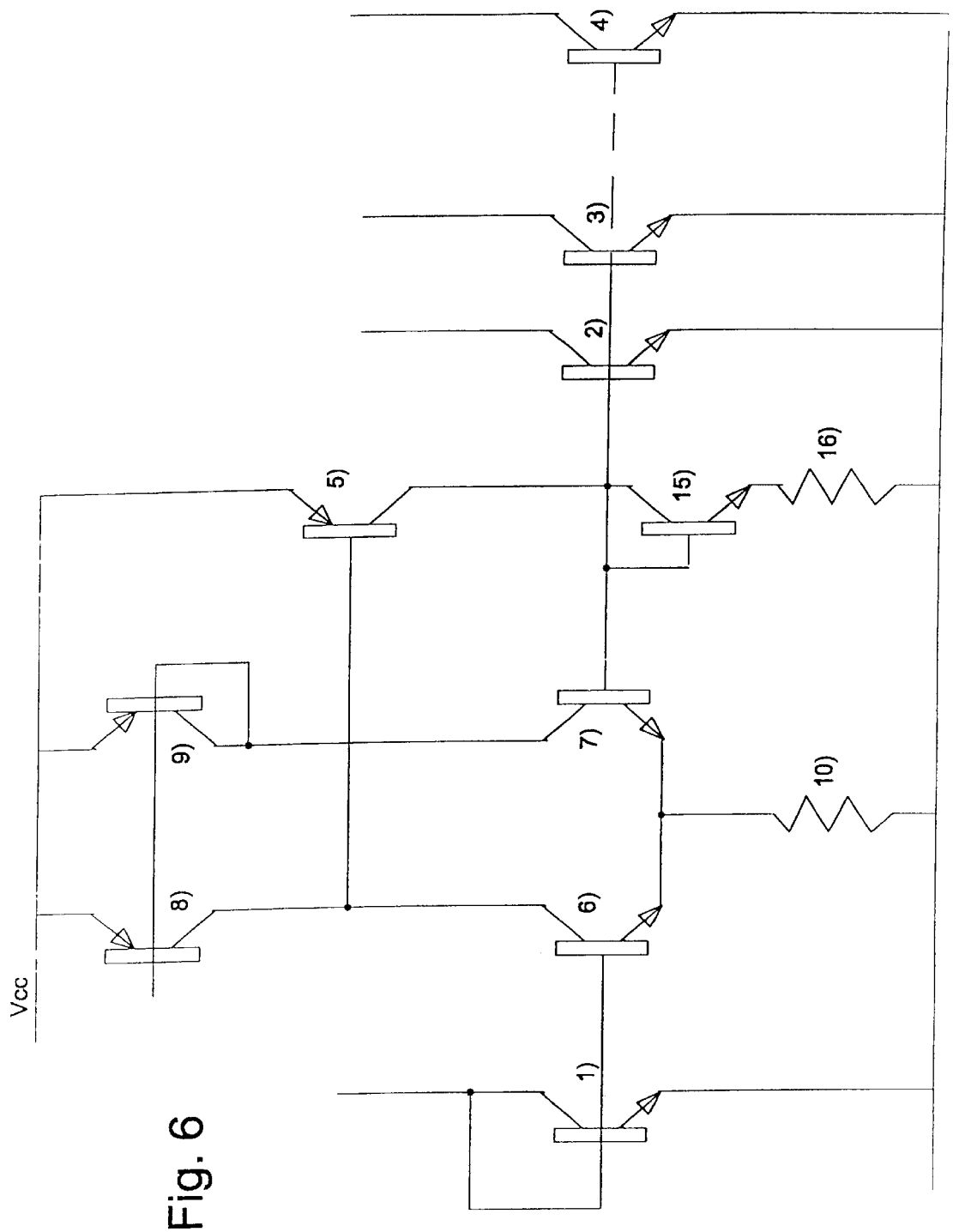

Another embodiment of the invention is shown in FIG. 6. The output transistor 5) has been changed from an emitter follower to a common emitter configuration. This adds an inversion in the path. To maintain the same gain polarity or sense (positive input from the reference diode results in positive output to the driven control rail) on the output driving the base rail of the controlled transistors 2), 3), and 4), it is necessary to take the input to transistor 5) from the opposite collector of the differential pair 6) –7). The PNP mirror of the amplifier must also be reversed to accommodate the change in gain polarity. Transistor 15) and resistor 16) are included to provide base current compensation for the PNP mirror in the amplifier. This is done to maintain a more accurate balance in the amplifier in order to faithfully reproduce the reference diode voltage on the driven base rail. If the amplifier bias current through resistor 10) is denoted as I, then the collectors of transistors 6) and 7) will each conduct I/2 if the circuit is balanced. The base current supplied by the collector node of transistors 7) and 9) to the PNP transistors 8) and 9) will be (I/2+I/2)/BetaP=I/BetaP, where BetaP is the forward common emitter current gain of the PNP transistors. In many bipolar processes BetaP is low and varies considerably from manufacture to manufacture. If transistor 15) is chosen to have twice the emitter area of transistor 6) or transistor 7) (presumed of equal area to maintain balance) and resistor 16) is chosen equal to resistor 10), the current flowing through diode connected transistor 15 and resistor 16 will be I, since the voltage from the base of transistor 7) to ground is impressed on both paths (through the base emitter junction of transistor 7) and thence through resistor 10) and through the base emitter junction of transistor 15) and thence through resistor 16)). This current (I) is supplied from the collector of PNP transistor 5), so its base current will be I/BetaP, supplied from the collector node of transistors 6 and 8). Hence the currents drawn from the collector nodes of the amplifier are equal, and balance is maintained. With adequate BetaP, or in designs where the improved accuracy is not required, transistor 15) and resistor 16) can be omitted. As in the circuits of FIG. 3 or FIG. 4, resistance from the emitter node of the amplifier to ground may be used to control the gain of the amplifier independent of emitter degeneration used to enhance the accuracy of the basic current mirror. The advantage of the circuit of FIG. 6 over that of FIG. 4 is that it will operate with lower values of power supply voltage Vcc. In FIG. 6 there is but one diode voltage drop between Vcc and the controlled rail (the base—emitter junction of transistor 5), as compared to two diode drops (the base emitter junctions of transistors 5) and 9) ) in FIG. 4.

Figure 7:
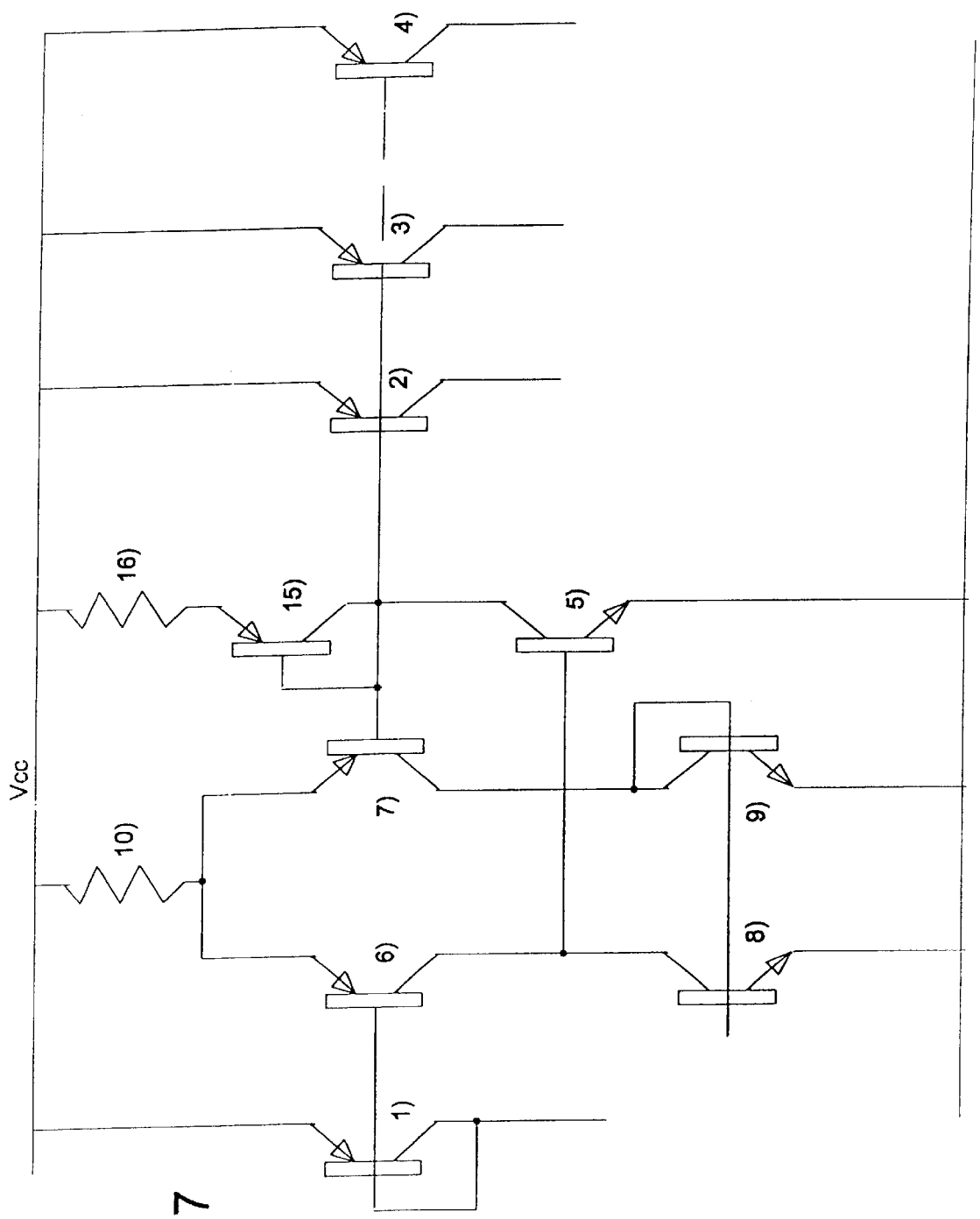

The complementary circuit to FIG. 6 is shown in FIG. 7. The above discussion of FIG. 6 applies to FIG. 7 with the currents reversed. As before, emitter degeneration may be used in the circuits of FIG. 6 and FIG. 7 to enhance the accuracy of the current mirror and transistor 15) and resistor 16) may be omitted if not required.

The present invention can also be implemented in CMOS circuits, but such implementation has lower utility, since the controlled transistors typically do not require significant gate current. PMOS versions analogous to the improved NPN mirrors of FIGS. 3 and 6, and NMOS versions analogous to the improved PNP mirrors of FIGS. 5 and 7 will be obvious to skilled integrated circuit designers.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description but rather by the claims appended hereto.

We claim:

1. A current control circuit comprising:
   a reference diode receiving reference current to its input;
   an amplifier having positive and negative inputs and one output;
   at least one controlled transistor;
   a connection from the input of the reference diode to the positive input of the amplifier;
   a connection from the base of the controlled transistor to the negative input of the amplifier; and
   a connection from the output of the amplifier to the negative input of the amplifier, wherein resistors are interposed between a common node and the reference diode and between the common node and the emitter of the controlled transistor.

2. A current control circuit, comprising:
   a reference diode receiving reference current to its input;
   an amplifier having positive and negative inputs and one output; said amplifier comprising:
      First and second transistors with a connection between the emitter of the first transistor and the emitter of the second transistor;
      third and fourth complementary transistors with collectors connected to the collectors of the first and the second transistors respectively;
      a connection between the emitter of the third transistor and the emitter of the fourth transistor;
      a connection between the base of the third transistor and the base of the fourth transistor;
      a connection between the base of the third transistor and the collector of the third transistor;
      a fifth transistor with base connected to the collector of the fourth transistor;
      a connection from the collector of the fifth transistor to the emitter of the fourth transistor; wherein the emitter of the fifth transistor comprises the output of the amplifier, the base of the first transistor comprises the positive input of the amplifier, and the base of the second transistor comprises the negative input to the amplifier;
   at least one controlled transistor;
   a connection from the input of the reference diode to the positive input of the amplifier;
   a connection from the base of the controlled transistor to the negative input of the amplifier; and
   a connection from the output of the amplifier to the negative input of the amplifier.

3. A current control circuit according to claim 2, wherein the amplifier comprises:
   First and second transistors with a connection between the emitter of the first transistor and the emitter of the second transistor;
   a resistor between the emitter of the first transistor and a common node;
   third and fourth complementary transistors with collectors connected to the collectors of the first and the second transistors respectively;
   a connection between the emitter of the third transistor and the emitter of the fourth transistor;
   a connection between the base of the third transistor and the base of the fourth transistor;
   a connection between the base of the third transistor and the collector of the third transistor;
   a fifth transistor with base connected to the collector of the fourth transistor; wherein the emitter of the fifth transistor comprises the output of the amplifier, the base of the first transistor comprises the positive input of the amplifier, and the base of the second transistor comprises the negative input to the amplifier.

4. A current control circuit, comprising:
   a reference diode receiving reference current to its input;
   an amplifier having positive and negative inputs and one output, said amplifier comprising:
      First and second transistors with a connection between the emitter of the first transistor and the emitter of the second transistor;
      third and fourth complementary transistors with collectors connected to the collectors of the first and the second transistors respectively;
      a connection between the emitter of the third transistor and the emitter of the fourth transistor;
      connection between the base of the third transistor and the base of the fourth transistor;
      a connection between the base of the fourth transistor and the collector of the fourth transistor;
      a fifth transistor with base connected to the collector the third transistor;
      a connection from the emitter of the fifth transistor to the emitter of the fourth transistor; wherein the collector of the fifth transistor comprises the output of the amplifier, the base of the first transistor comprises the positive input of the amplifier, and the base of the second transistor comprises the negative input to the amplifier;
   at least one controlled transistor;
   a connection from the input of the reference diode to the positive input of the amplifier;
   a connection from the base of the controlled transistor to the negative input of the amplifier; and
   a connection from the output of the amplifier to the negative input of the amplifier.

5. A current control circuit according to claim 4 wherein the amplifier comprises:
   First and second transistors with a connection between the emitter of the first transistor and the emitter of the second transistor;
   a resistor between the emitter of the first transistor and a common node;
   third and fourth complementary transistors with collectors connected to the collectors of the first and the second transistors respectively;
   a connection between the emitter of the third transistor and the emitter of the fourth transistor;
   a connection between the base of the third transistor and the base of the fourth transistor;
   a connection between the base of the fourth transistor and the collector of the fourth transistor;
   a fifth transistor with base connected to the collector of the third transistor;
   a connection from the emitter of the fifth transistor to the emitter of the fourth transistor;
   wherein the collector of the fifth transistor comprises the output of the amplifier, the base of the first transistor comprises the positive input of the amplifier, and the base of the second transistor comprises the negative input to the amplifier.

6. A current control circuit according to claim 4 wherein the amplifier comprises:
   First and second transistors with a connection between the emitter of the first transistor and the emitter of the second transistor;

third and fourth complementary transistors with collectors connected to the collectors of the first and the second transistors respectively;

a connection between the emitter of the third transistor and the emitter of the fourth transistor;

a connection between the base of the third transistor and the base of the fourth transistor;

a connection between the base of the fourth transistor and the collector of the fourth transistor;

a fifth transistor with base connected to the collector of the third transistor;

a connection from the emitter of the fifth transistor to the emitter of the fourth transistor;

a sixth transistor with base and collector connected to the base of the second transistor;

a connection between the emitter of the sixth transistor and the emitter of the second transistor;

wherein the collector of the fifth transistor comprises the output of the amplifier, the base of the first transistor comprises the positive input of the amplifier, and the base of the second transistor comprises the negative input to the amplifier.

7. A current control circuit according to claim 3 wherein the amplifier comprises:

First and second transistors with a connection between the emitter of the first transistor and the emitter of the second transistor;

a resistor between the emitter of the first transistor and a common node;

third and fourth complementary transistors with collectors connected to the collectors of the first and the second transistors respectively;

a connection between the emitter of the third transistor and the emitter of the fourth transistor;

a connection between the base of the third transistor and the base of the fourth transistor;

a connection between the base of the fourth transistor and the collector of the fourth transistor;

a fifth transistor with base connected to the collector of the third transistor;

a connection from the emitter of the fifth transistor to the emitter of the fourth transistor;

a sixth transistor with base and collector connected to the base of the second transistor;

a second resistor connected between the emitter of the sixth transistor and the common node;

wherein the collector of the fifth transistor comprises the output of the amplifier, the base of the first transistor comprises the positive input of the amplifier, and the base of the second transistor comprises the negative input to the amplifier.

* * * * *